United States Patent
Chen et al.

(10) Patent No.: US 11,596,069 B2
(45) Date of Patent: Feb. 28, 2023

(54) EASY RELEASE BOARD TO BOARD CONNECTOR

(71) Applicant: Quanta Computer Inc., Taoyuan (TW)

(72) Inventors: Chao-Jung Chen, Taoyuan (TW); Chih-Hsiang Lee, Taoyuan (TW); Hou-Hsien Chang, Taoyuan (TW); Wei-Chih Hung, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/516,456

(22) Filed: Nov. 1, 2021

(65) Prior Publication Data

US 2023/0034074 A1   Feb. 2, 2023

Related U.S. Application Data

(60) Provisional application No. 63/203,700, filed on Jul. 28, 2021.

(51) Int. Cl.
*H05K 1/14* (2006.01)
*H05K 7/14* (2006.01)

(52) U.S. Cl.
CPC ............. *H05K 1/144* (2013.01); *H05K 1/148* (2013.01); *H05K 7/1409* (2013.01); *H05K 2201/042* (2013.01)

(58) Field of Classification Search
CPC ...... H05K 1/144; H05K 1/148; H05K 7/1409; H05K 2201/042
USPC .......................................................... 361/785
See application file for complete search history.

(56) References Cited

U.S. PATENT DOCUMENTS

| 2015/0092339 A1* | 4/2015 | Li | G06F 1/181 |
| | | | 74/470 |
| 2016/0054767 A1* | 2/2016 | Chen | G06F 1/1658 |
| | | | 312/223.2 |

* cited by examiner

*Primary Examiner* — Andargie M Aychillhum
(74) *Attorney, Agent, or Firm* — Nixon Peabody LLP (57) ABSTRACT

A connector assembly for connecting an upper circuit board to a lower circuit board is disclosed. The upper circuit board includes a series of fastener holes for a fastening device allowing attachment to the lower circuit board. The connector assembly has a support bracket with access holes aligned with the holes of the upper circuit board. The support bracket is configurable to be positioned over the upper circuit board. The connector assembly has a moveable cover bracket having a series of access holes. The cover bracket is suspended between the support bracket and the cover bracket. The cover bracket is moveable between an open position aligning the access holes with the access holes of the support bracket, and a closed position. In the closed position, the cover bracket blocks access between the access holes of the support bracket and the holes of the upper circuit board.

20 Claims, 12 Drawing Sheets

EASY RELEASE BOARD TO BOARD CONNECTOR

CROSS-REFERENCE TO RELATED APPLICATIONS

This application claims priority from and benefit of U.S. Provisional Patent Application Ser. No. 63/203,700, filed on Jul. 28, 2021, titled "Foolproof device with synchronization function," which is hereby incorporated by reference herein in its entirety.

TECHNICAL FIELD

The present disclosure relates generally to mechanisms to connect circuit boards, and more specifically, to a connection mechanism allowing easy assembly of two circuit boards.

BACKGROUND

Computer servers are computer devices generally designed for certain specialized functions. Servers generally include common components such as processors, memory, a cooling system, and a power system. Generally, servers have a chassis that has walls of a certain height that may be standardized for insertion of the chassis in racks in a data center. The chassis generally holds a motherboard with the basic components such as the processors, dual in-line memories (DIMMs), storage devices, fans, and power supplies. Servers can be specially designed to enhance performance of certain functions. For example, an application server may have relatively more processors for processing applications, or a storage server may have more storage devices for more storage capability. However, it is often desirable to expand the functions of the server though additional components, such as network interface cards, memories, or processors.

Modern servers are designed to allow a user the flexibility of adding or enhancing functions in a computer system through adding circuit boards with additional hardware for enhanced functionality. The additional circuit boards that may be inserted in the server chassis over an existing circuit board, and include functional components that may be electrically connected to the other server components through the existing circuit board. A server chassis generally has a horizontally oriented motherboard at the bottom of the chassis. Additional circuit boards can be inserted on connectors extending from the motherboard.

For example, an upper expansion circuit board may be placed on a lower circuit board that may be a motherboard for a server. The lower circuit board may include a number of rectangular shaped board-to-board connectors. Each of the board-to-board connectors may be electrically connected to corresponding connectors on the bottom side of the upper circuit board. A series of spacers extend from each corner of the board-to-board connectors. The spacers help support the upper circuit board. Each spacer is a cylinder that has a hole to receive a fastening mechanism such as a screw. Thus, where there are four board-to-board connectors, there are sixteen total spacers; thereby requiring sixteen screws to attach the upper circuit board with the lower circuit board.

Assembly of the upper circuit board to the lower circuit board is accomplished by lowering the upper circuit board so the connectors mate with the board-to-board connectors on the lower circuit board. Once the board-to-board connectors of the lower circuit board are mated with the connectors on the bottom of the upper circuit board, a locking mechanism may be engaged to insure electrical connection. A lever or other mechanism may be used to join various connection mechanisms such as pins and slots. The last step is to insert screws to fix the upper circuit board to each of the spacers of the lower circuit board. Thus, in the case of four board-to-board connectors, each with four spacers, sixteen screws are required.

However, when disassembling the circuit boards, it is difficult to ensure a user removes all sixteen of the screws before activating the unlocking mechanism to disassemble the upper circuit board from the lower circuit board. Users often do not know which screws should be installed or disassembled when assembling or disassembling a complicated pattern of screws on the upper circuit board. A user may reference a manual or review descriptions in a standard operation procedure (SOP) file for the circuit boards, but consulting such references increases the time for the disassembly operation. Mistakes in removing the wrong screw may potentially damage the structure due to improper operation. Alternatively, if a user fails to remove one of the screws, the upper circuit board may be damaged when the user attempts to pull it away from the lower circuit board.

Thus, there is a need for a quick connection mechanism to disconnect two stacked circuit boards that ensures all screws are removed. There is another need for a mechanical device in a connection assembly that prevents the use of lever locking mechanism until all the screws have been removed. There is another need for a connection mechanism that indicates whether the disassembly of a circuit board from another circuit board can proceed.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

An example connector assembly for connecting an upper circuit board to a lower circuit board is disclosed. The upper circuit board includes a fastener hole for a fastening device allowing attachment to the lower circuit board. The connector assembly has a support bracket with a first access hole aligned with the fastener hole of the upper circuit board. The support bracket is configurable to be positioned over the upper circuit board. The connector assembly includes a moveable cover bracket having a second access hole. The cover bracket is suspended between the support bracket and the upper circuit board. The cover bracket is moveable between an open position and a closed position. The first and second access holes are aligned in the open position. The cover bracket blocks access between the first access hole of the support bracket and the upper circuit board in the closed position.

A further implementation of the example connector assembly is where the upper circuit board includes a connector that may be mated with a board-to-board connector of the lower circuit board. Another implementation is where the support bracket includes a side plate that contacts the lower circuit board. Another implementation is where the side plate includes a rotating lever that is attached to a connection mechanism to engage a side bracket of the lower circuit board. The rotating lever rotates between a locked position and an unlocked position. Another implementation is where the cover bracket includes a cover plate extending through the support bracket. The cover plate is extended over the lever when the cover bracket is in the open position to prevent the lever from being rotated to the unlocked position. Another implementation is where the fasteners are screws. Another implementation is where the support bracket includes an indicator indicating the open or closed position. Another implementation is where the connector assembly includes a handle attached to the cover bracket extending through a slot in the support bracket. Another implementation is where the connector assembly includes a gear and another cover bracket including a rack engaging the gear. The cover bracket includes a rack engaging the gear. Another implementation is where the fastening device engages a spacer connected to the lower circuit board. Another implementation is where the board-to-board connector is a rectangular shape, and wherein the spacer is one of four spacers in proximity to the board-to-board connector.

Another disclosed example is a computer system having a lower circuit board including a series of spacers. The computer system has an upper circuit board including a series of screw holes each in alignment with one of the spacers. The computer system includes a connection assembly having a support bracket positioned over the upper circuit board. A first and second cover bracket are suspended between the support bracket and the upper circuit board. The support bracket includes a series of screw access holes. The cover brackets each include a series of screw access holes. The cover brackets have a closed position relative to the support bracket that aligns the screw access holes to allow access to the screw holes. The cover brackets have an open position that blocks the screw access holes of the support bracket to the screw holes of the upper circuit board.

A further implementation of the example computer system is where the upper circuit board includes a connector that may be mated with a board-to-board connector of the lower circuit board. Another implementation is where each support bracket includes a side plate that contacts the lower circuit board. Another implementation is where the side plates each include a rotating lever that is attached to a connection mechanism to engage a side bracket of the lower circuit board. The rotating levers rotate between a locked position and an unlocked position. Another implementation is where each cover bracket includes a cover plate extending through the support bracket. The cover plates are extended over the levers when the cover brackets are in the open position to prevent the levers from being rotated to the unlocked position. Another implementation is where the support bracket includes an indicator indicating the open or closed position. Another implementation is where the computer system includes a handle attached to each of the cover brackets. Each of the handles extend through a slot in the support bracket. Another implementation is where the computer system further includes a gear attached to a lower surface of the upper circuit board. Each cover bracket includes a rack engaging the gear.

Another disclosed example is a method of assembling an upper circuit board with an attached connector assembly to a lower circuit board. The connector assembly is attached to the upper circuit board and includes a cover bracket with a support bracket suspended over the upper circuit board. A board-to-board connector of the lower circuit board is mated with the upper circuit board. A cover bracket having an access hole is moved to an open position to allow activation of an attachment mechanism. The cover bracket is moved to a closed position relative to a support bracket to align the access hole with an access hole of the support bracket. A screw is inserted through the aligned access holes to attach the upper circuit board to a spacer of the lower circuit board.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

The present disclosure is directed toward a board-to-board connection assembly that includes a support bracket and a moveable set of cover brackets that may be moved between a closed and open position. The connection assembly is mounted on a circuit board that may be stacked on another circuit board. The support bracket includes side levers that allow for physical connection of the two boards. The support bracket includes screw access holes that are in positional alignment with corresponding spacers extending from the lower circuit board. The cover brackets have a closed position that allows access to the screw holes and positions a cover plate over the side levers. The screws may thus be inserted through the screw access holes when the cover brackets are in the closed position to secure the circuit boards together. When the upper circuit board is required to be removed, the connection assembly ensures that the levers cannot be activated until all of the screws are removed from the support bracket. The cover brackets may then be moved to an open position to allow the levers to release the boards. In this manner, the upper circuit board may be disassembled without risk of damage from inadvertently leaving a screw in place.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1A:
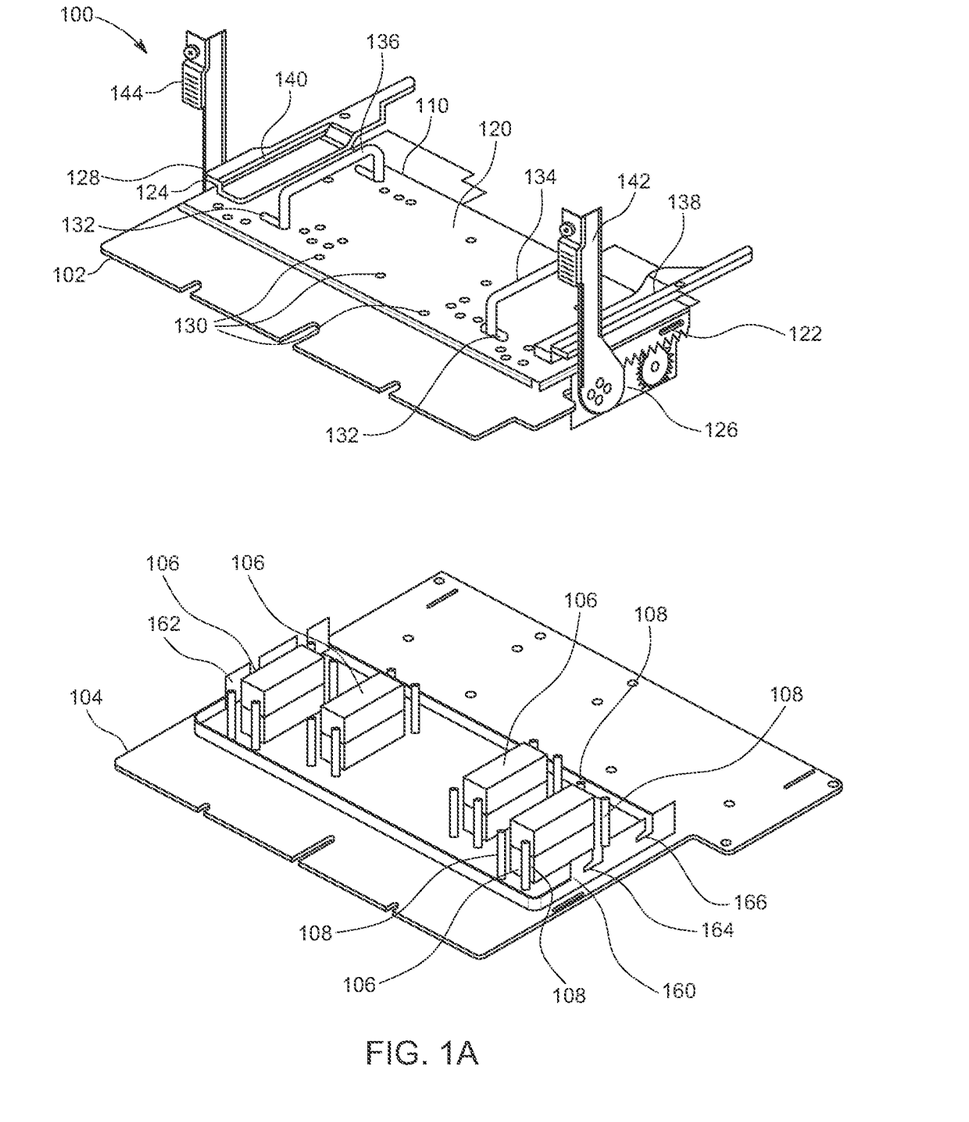
FIG. 1A is an unassembled view of stacked circuit boards with an example connection assembly, according to certain aspects of the present disclosure.
Figure 1B:
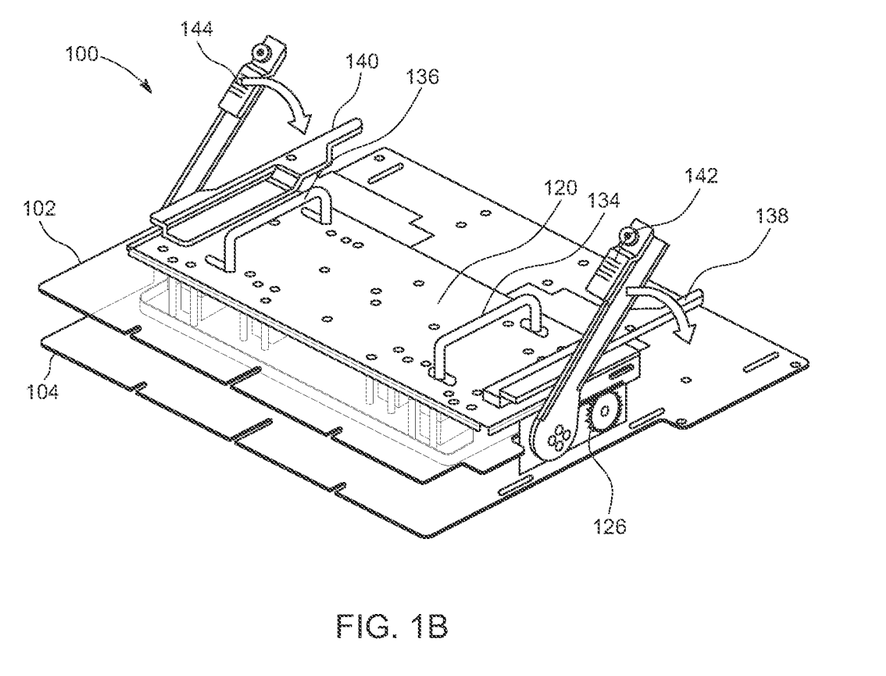
FIG. 1B is a view of the stacked circuit boards in FIG. 1A in the process of being assembled with the example connection assembly, according to certain aspects of the present disclosure.

FIGS. 1A-1B show an exploded and assembled view of a multi-circuit board system 100, such as a computer server. The system 100 includes an upper expansion circuit board 102 that may be placed on a lower circuit board 104. In this example, the lower circuit board 104 may be a motherboard for a computer server. The lower circuit board 104 may include four rectangular shaped board-to-board connectors 106 that extend from the top surface of the circuit board 104. Each of the board-to-board connectors 106 may be electrically connected to corresponding connectors on the bottom side of the upper circuit board 102. A series of spacers 108 are located in proximity to each corner of the board-to-board connectors 106. The spacers 108 help support the upper circuit board 102. Each spacer 108 is a cylinder that has a hole to receive a fastening mechanism such as a screw.

A connector assembly 110 is attached to the upper circuit board 102 to assist in attaching the upper circuit board 102 to the lower circuit board 104. The connector assembly 110 includes a support bracket 120 that is suspended over the upper surface of the circuit board 102. The support bracket 120 is a rectangular plate having opposite sides 122 and 124. Each of the sides 122 and 124 of the support bracket 120 includes a respective side plate 126 and 128 that extend perpendicularly down from the sides 122 and 124. The circuit board 102 is supported by the side plates 126 and 128 of the connector assembly 110. The bottom edges of the side plates 126 and 128 rest on the top surface of the circuit board 104 when the circuit boards 102 and 104 are assembled together.

The support bracket 120 includes screw access holes 130 that correspond in location to the spacers 108 of the lower circuit board 104. In this example, there are sixteen screw access holes 130 that correspond to the four spacers 108 for each of the connectors 106 of the lower circuit board 104. Of course, any number of screw access holes may be provided in any pattern on the support bracket 120 to accommodate any number of connectors and spacer connection points. The support bracket 120 also includes a series of handle slots 132. Two moveable handles 134 and 136 extend from the handle slots 132. Two moveable cover plates 138 and 140 are located near the sides 122 and 124 respectively.

Each of the side plates 126 and 128 supports a corresponding rotating lever 142 and 144. Both levers 142 and 144 are identical and may be rotated between an open and a locked position to assist in securing the upper circuit board 102 to the lower circuit board 104. FIGS. 1A-1B show the levers 142 and 144 in the open position.

The lower circuit board 104 mounts two side brackets 160 and 162 that are positioned to be in proximity to the respective side plates 126 and 128 of the connector assembly 110. Thus, when the upper circuit board 102 is lowered on the lower circuit board, the side plates 126 and 128 are inserted between the side brackets 160 and 162. The side brackets 160 and 162 include L-shaped slots 164 and 166 that allow pins connected to the levers 142 and 144 to be locked into the slots 164 and 166.

Figure 1C:
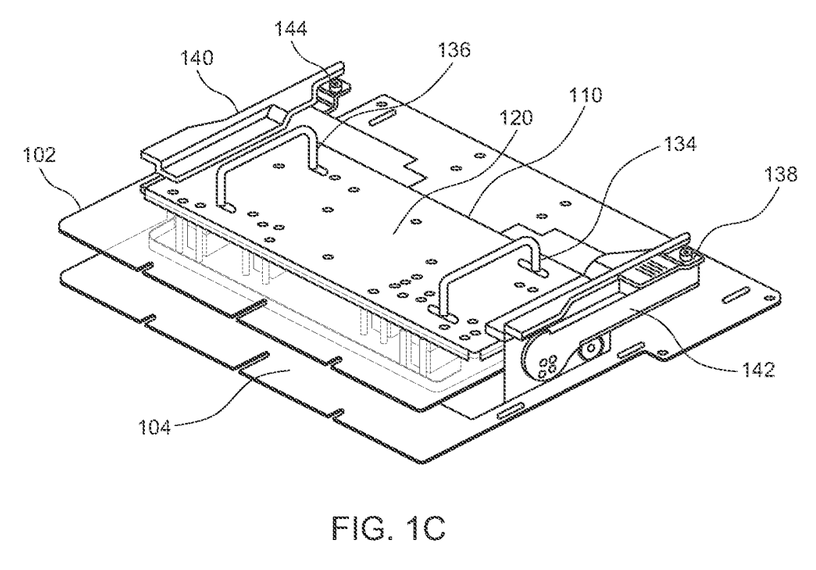
FIG. 1C is a view of stacked circuit boards in FIG. 1A that have been locked together with the example connection assembly, according to certain aspects of the present disclosure.

As shown in FIG. 1B, assembly of the upper circuit board 102 to the lower circuit board 104 is accomplished by lowering the upper circuit board 102 so the connectors on the bottom of the upper circuit board 102 mate with the board-to-board connectors 106 on the lower circuit board 104. The pins that are connected to the levers 142 and 144 are inserted in the slots 164 and 166 of the respective side brackets 160 and 162. The bottom edges of the side plates 126 and 128 rest on the top surface of the lower circuit board 104. The board-to-board connectors 106 allow electrical connections between the upper circuit board 102 and the lower circuit board 104. Once the board-to-board connectors 106 of the lower circuit board 104 are mated with the connectors on the bottom of the upper circuit board 102, the levers 142 and 144 may be rotated to a locked position as shown in FIG. 1C.

Figure 2A:
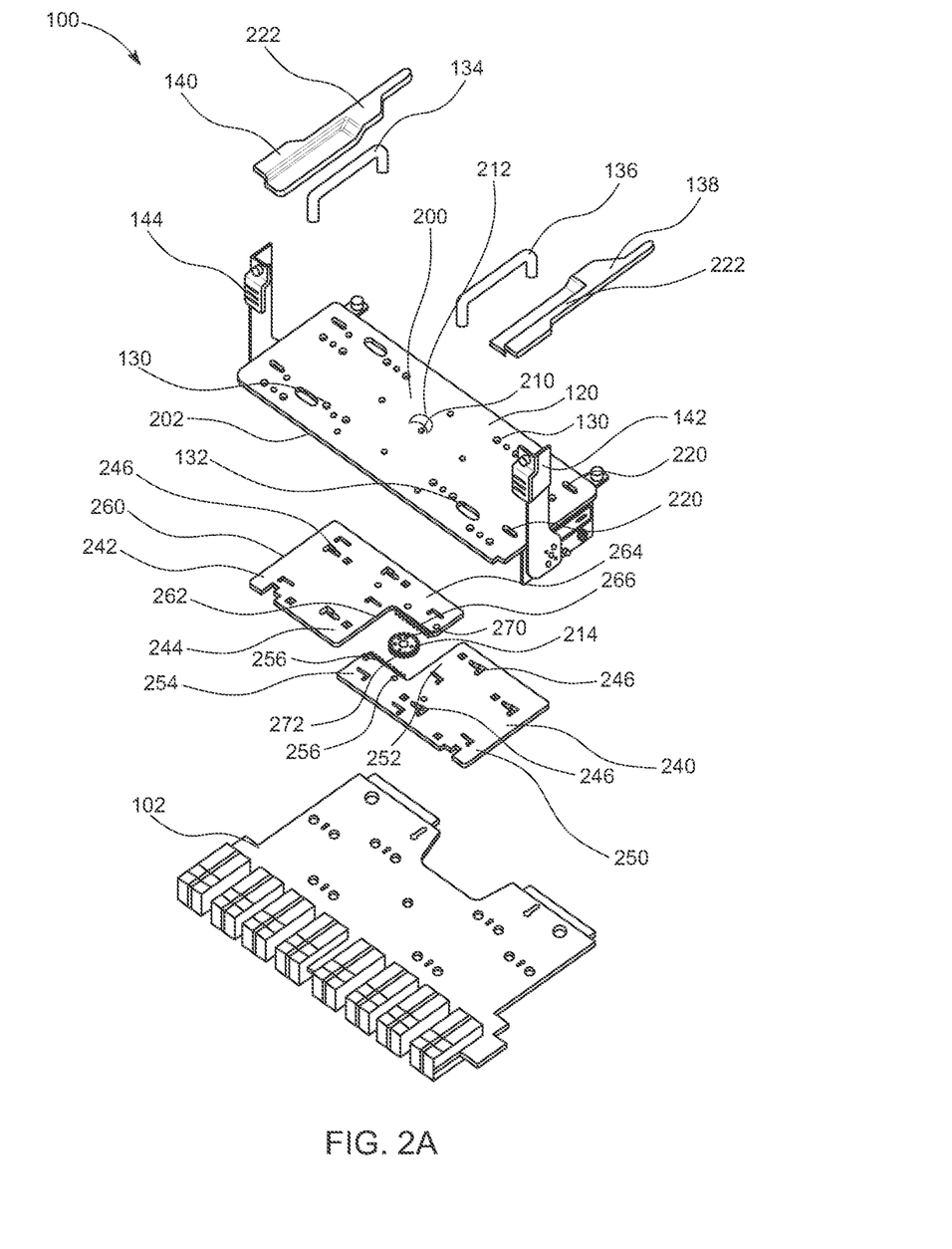
FIG. 2A is an exploded view of an example connector assembly in FIG. 1A for joining a circuit board to another circuit board, according to certain aspects of the present disclosure.

Each of the levers 142 and 144 are connected to a gearing mechanism. When the levers 142 and 144 are rotated to the locked position in FIG. 1C, the pins in the slots 164 and 166 of the side brackets 160 and 162 are pushed into the slots 164 and 166 in FIG. 2 via the gearing mechanism and thus the connector assembly 110 and upper circuit board 102 are locked into place with the lower circuit board 104. Of course, mechanisms other than the lever and pin mechanism may be used to lock the upper circuit board 102 to the lower circuit board 104.

As will be explained below, once the levers 142 and 144 are rotated into the locked position, the handles 134 and 136 may be used to move the cover plates 138 and 140 over the levers 142 and 144 to prevent their rotation to the unlocked position. Once the cover plates 138 and 140 are moved, the screw access holes 130 of the support bracket 120 will have access to allow screws to be inserted through the circuit board 102 to the spacers 108. The final step after rotating the levers 142 and 144 to lock the upper circuit board 102 in place is to insert screws in the screw access holes 130 to fix the upper circuit board 102 to each of the spacers 108.

Figure 2B:
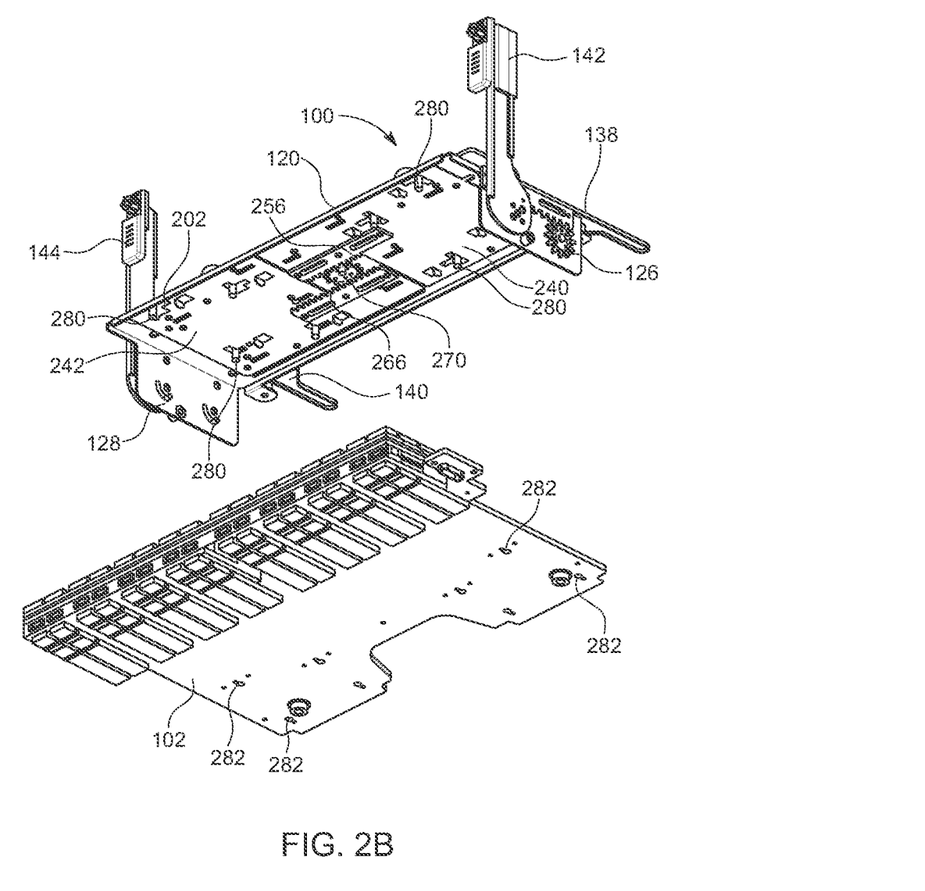
FIG. 2B is a bottom perspective view of the example connector assembly prior to attachment to a circuit board, according to certain aspects of the present disclosure.

FIG. 2A shows an exploded view of the components of the example connector assembly 110 attached to the upper circuit board 102. FIG. 2B is a bottom perspective view of the example connector assembly 100 prior to attachment to the top circuit board 102. Identical elements in FIGS. 2A-2B are labeled with identical numerals to their counterparts in FIGS. 1A-1C. In this example, the support bracket 120 is a rectangular plate having a top surface 200 and an opposite bottom surface 202. The top surface 200 of the support bracket 120 has the screw access holes 130 labeled by number to assist in tracking the screws necessary to attach the upper circuit board 102 to the spacers 108 of the lower circuit board 104 shown in FIG. 1A-1C. The top surface 200 of the support bracket 120 also includes a gear screw access hole 210 located near the center of the top surface 200. A semi-circular slot 212 allows the transversal of an indicator pin 214 between an open position and a closed position. The position of the indicator pin 214 indicates whether the connector assembly 110 is in an open or closed position. Two cover plate slots 220 are located near each of the sides 122 and 124 of the support bracket 120. The cover plates 138 and 140 are each suspended by pins that traverse in the cover plate slots 220. The cover plates 138 and 140 include a support member that is attached to the pins. The support member is attached to a lateral cover 222 that is shaped to extend over the respective levers 142 and 144.

The bottom surface 202 of the support bracket 120 include a series of pins arranged in a pattern. A right cover bracket 240 and a left cover bracket 242 are suspended between the support bracket 120 and the circuit board 102. The right and left cover brackets 240 and 242 are plates that are suspended by the pins 230 engaging slots 244 of the brackets 240 and 242. Both cover brackets 240 and 242 include screw access holes 246 in the same pattern as the screw access holes 130 of the support bracket 120. The right cover bracket 240 includes a side edge 250 that supports the handle 134 and the pins attached to the cover plate 138. An opposite side edge 252 includes a rack extension 254 that supports a geared rack 256. The left cover bracket 242 includes a side edge 260 that supports that support the handle 136 and the pins attached to the cover plate 140. An opposite side edge 262 includes a rack extension 264 that supports a geared rack 266.

The bottom surface 202 of the support bracket 120 includes a gear 270 that engages the geared rack 256 of the right cover bracket 240 and the geared rack 266 of the left cover bracket 242. The gear 270 is attached to the indicator pin 214, and therefore the gear 270 rotates the indicator pin 214. The gear 270 includes a screw hole 272 that allows the gear 270 to be locked into place by inserting a screw through the screw access hole 210 on the support bracket 120. Moving either of the handles 136 or 138 causes the corresponding rack 256 or 266 to rotate the gear 270, and thereby move the other rack 256. The cover brackets 240 and 242 may be moved to a closed position that aligns the screw access holes 246 with the screw holes 130 of the support bracket 120, allowing either insertion or removal of screws. The cover brackets 240 and 242 may also be moved to an open position that blocks the screw access holes 130, preventing the insertion of screws through the circuit board 102.

The bottom surface 202 of the support bracket 120 includes a series of mounting pins 280. The mounting pins 280 are positioned in various areas of the bottom surface 202 that allow them to not interfere with the movement of the cover brackets 240 and 242. The circuit board 102 has corresponding mounting slots 282 that are positioned in alignment with the mounting pins 280 when the support bracket 120 is attached to the circuit board 102.

Figure 2C:
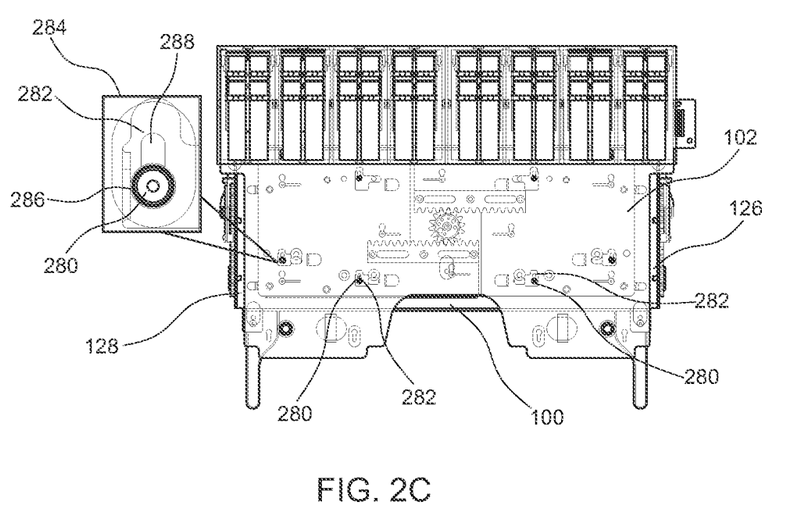
FIG. 2C is a bottom view of the example connector assembly aligned to a circuit board, according to certain aspects of the present disclosure.
Figure 2D:
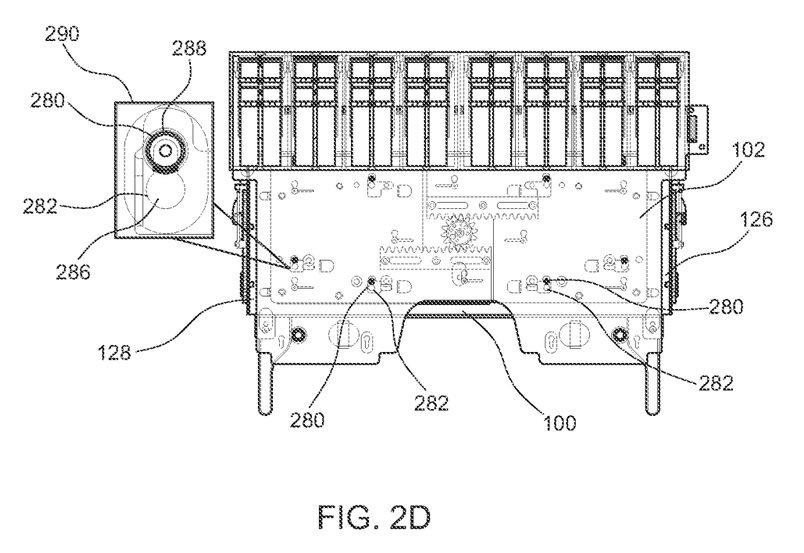
FIG. 2D is a bottom view of the example connector assembly locked to the circuit board according to certain aspects of the present disclosure.

FIG. 2C is a bottom view of the example connector assembly 100 when the mounting pins 280 are inserted in the corresponding mounting slots 282 of the circuit board 102. As shown in an inset 284, the mounting slots 282 have a circular end 286 that allows the head of the pin 280 to be inserted and an opposite narrow end 288. Once the pins 280 are inserted in the corresponding slots 282, the connector assembly 100 may be moved so the pins 280 are moved from the circular end 286 to the narrow end 288 and thus are locked in the slots 282 as shown in an inset 290 in FIG. 2D. The connector assembly 100 may be detached from the circuit board 102 by moving the connector assembly 100 so the pins 280 are shifted to the circular ends 286 of the respective slots 282. The connector assembly 100 may then be lifted off of the circuit board 102.

Figure 3A:
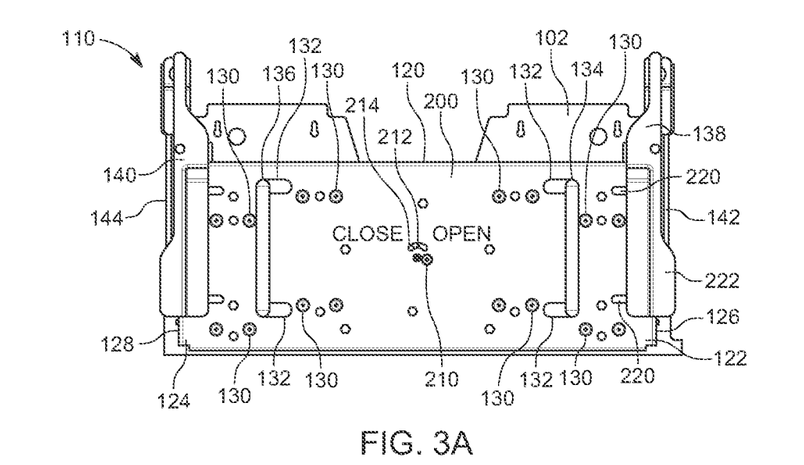
FIG. 3A is a top view of an example connector assembly in FIG. 2 in a closed position allowing installation of screws to join a circuit board to another circuit board, according to certain aspects of the present disclosure.
Figure 3B:
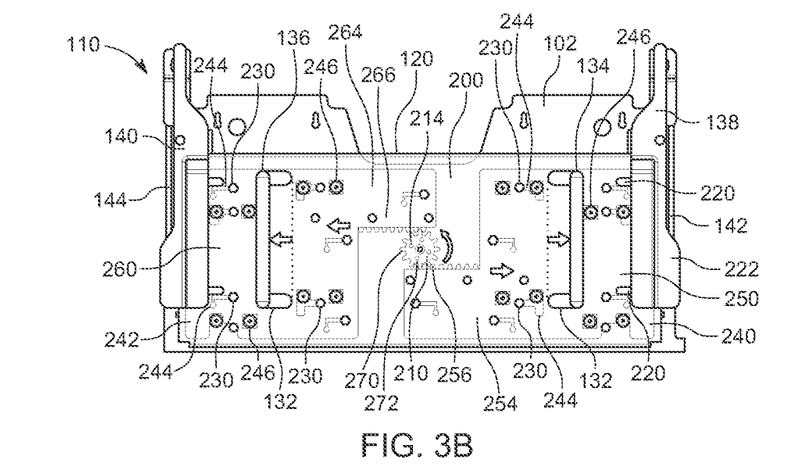
FIG. 3B is a top see-through view of the example connector assembly in FIG. 3A in the closed position allowing installation of screws to join a circuit board to another circuit board, according to certain aspects of the present disclosure.
Figure 3C:
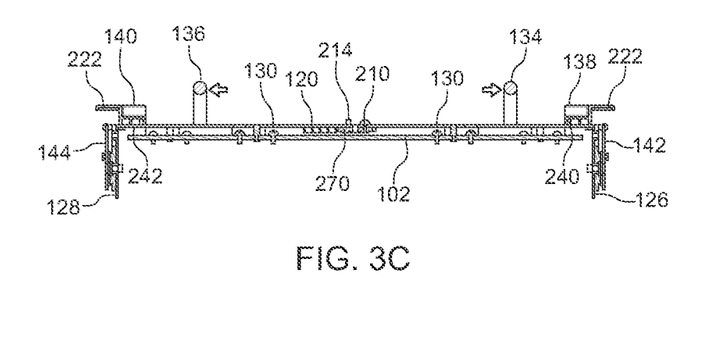
FIG. 3C is a side cross-section view of the example connector assembly in FIG. 3A in the closed position allowing installation of screws to join a circuit board to another circuit board, according to certain aspects of the present disclosure.

The closed position is shown in detail in FIGS. 3A-3C that show a top view, a top see-through view, and a side view respectively of the components of the connector assembly 110. Like elements in FIG. 3A-3C are labeled with the same number as their counterparts in FIG. 2. The closed position allows the final assembly of the upper circuit board 102 with the lower circuit board 104 in FIGS. 1A-1C. With reference to FIGS. 3A-3C, the right and left cover brackets 240 and 242 are moved toward the respective sides 122 and 124 of the support bracket 120. Thus, the lateral cover 222 of the side cover plate 138 is positioned over the lever 142. The lateral cover 222 of the side cover plate 138 therefore prevents access to the lever 142, and thus the lever 142 is held in the locked position and cannot be rotated to the unlocked position. Correspondingly, the lateral cover 222 of the side cover plate 140 is positioned over the lever 144. The lateral cover 222 of the side cover plate 140 therefore prevents access to the lever 144, and thus the lever 144 is held in the locked position and cannot be rotated to the unlocked position.

To engage the closed position, either of the handles 134 or 136 may be gripped by a user and pushed to the outer end of the handle slots 132. This causes the corresponding cover bracket 240 or 242 to rotate the gear 270 and thereby move the other cover bracket 240 or 242 through the rack mechanism. Once in the closed position, the indicator pin 214 is moved in the slot 212 by the gear 270 to indicate the connector assembly 110 is in the closed position. The screw hole 272 of the gear 270 is aligned with the gear screw access hole 210 of the support bracket 120. A screw may then be inserted through the gear screw access hole 210 and the screw hole 272 to lock the gear 270 in place. The cover brackets 240 and 242 thus are locked in the closed position.

In this manner, the screw holes 246 of the cover brackets 240 and 242 are aligned with the screw access holes 130 on the support bracket 120. Screws may thus be inserted through the screw access holes 130 and 246 to connect the circuit board 102 to the spacers 108 in FIGS. 1A-1C.

Figure 4A:
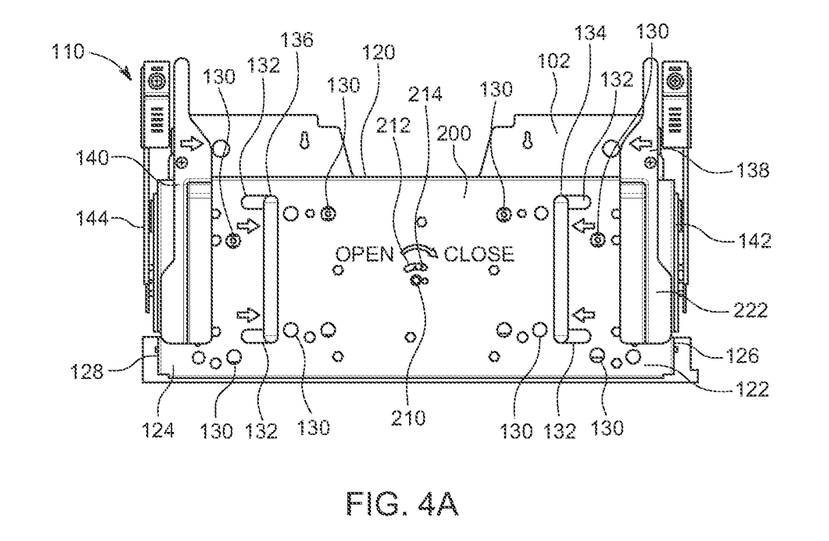
FIG. 4A is a top view of the example connector assembly in FIG. 2 in an open position allowing use of levers to detach the circuit board from another circuit board, according to certain aspects of the present disclosure.
Figure 4B:
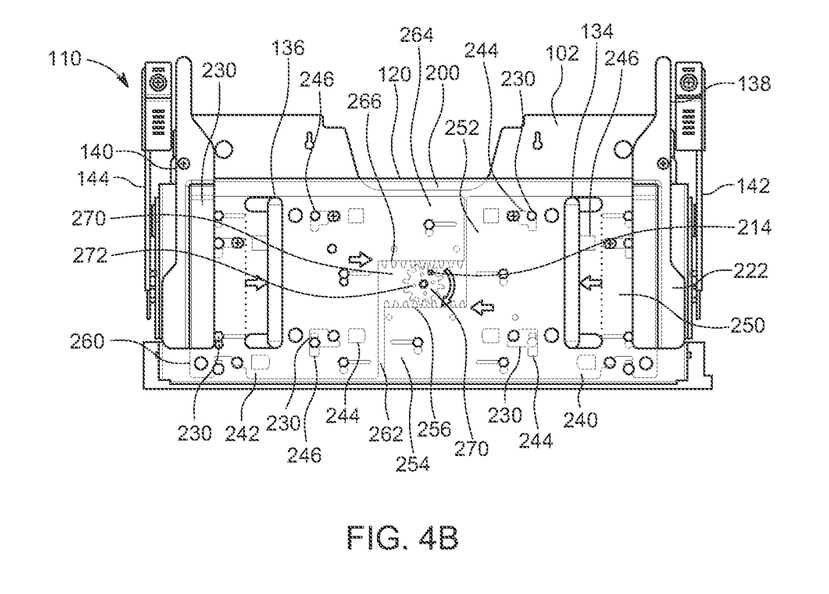
FIG. 4B is a top see-through view of the example connector assembly in FIG. 4A in an open position allowing use of levers to detach the circuit board from another circuit board, according to certain aspects of the present disclosure.
Figure 4C:
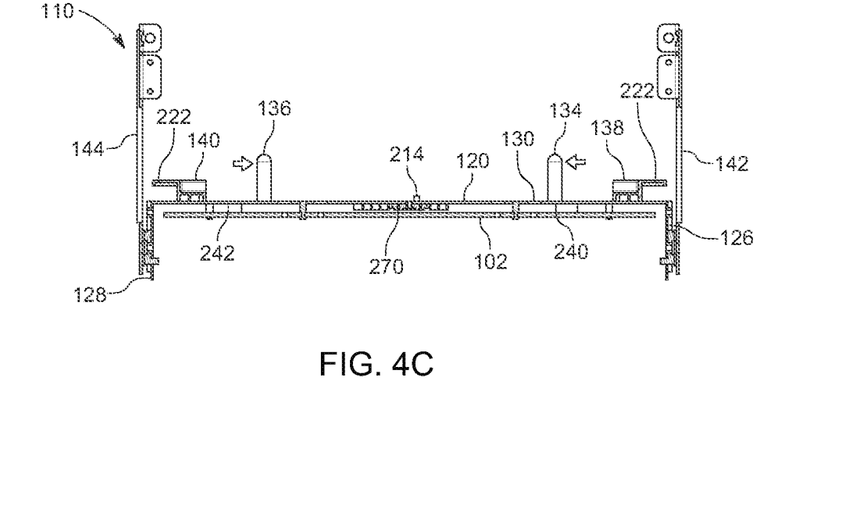
FIG. 4C is a side cross-section view of the example connector assembly in FIG. 4A in an open position allowing use of levers to detach the circuit board from another circuit board, according to certain aspects of the present disclosure.

If the user desires to disassemble the upper circuit board 102 from the lower circuit board 104, the user may remove all of the screws that attach the upper circuit board 102 to the spacers 108 of the lower circuit board 104. The screws may be removed through the screw access holes 130 and 210 of the top surface 200 of the support bracket 120. Once the screws are removed, the connector assembly 110 may be moved to the open position via one of the handles 134 and 136 to allow the disconnection from the connectors 106 in FIGS. 1A-1B The open position is shown in detail in FIGS. 4A-4C that show a top view, a top see-through view, and a side view respectively of the components of the connector assembly 110. Like elements in FIG. 4A-4C are labeled with the same reference numerals as their counterparts in FIG. 2. With reference to FIGS. 4A-4C, the right and left cover brackets 240 and 242 are moved away from the respective sides 122 and 124 of the support bracket 120 via either handle 134 or 136. Thus, the lateral cover 222 of the side cover plate 138 is positioned away from the lever 142. With the movement of the side cover plate 138 away from the lever 142, the lever 142 may be rotated to the unlocked position. Simultaneously, the lateral cover 222 of the side cover plate 140 is positioned away from the lever 144. The positioning of the side cover plate 140 inward, allows the lever 144 to be rotated to the unlocked position. The levers 142 and 144 may thus be rotated to the unlocked position, moving the pins in the slots 164 and 166 of the brackets 160 and 162 in FIG. 1B. This allows the disconnection of the board-to-board connectors 106 of the lower circuit board 104 from the connectors at the bottom of the upper circuit board 102 in FIGS. 1A-1B.

To engage the open position once all the screws are removed through the screw access holes 130 and 210, either of the handles 134 or 136 may be gripped by a user to move the handle to the inner end of the handle slots 132. This causes the corresponding cover bracket 240 or 242 to rotate the gear 270 and thereby move the other cover bracket 240 or 242 through the rack mechanism. Once in the open position, the indicator pin 214 is moved in the slot 212 to indicate the connector assembly 110 is in the open position. All of the screw access holes 130 are blocked by either the cover brackets 240 or 242, thus preventing insertion of screws through the circuit board 102 when the connector assembly 110 is in the open position.

Figure 5A:
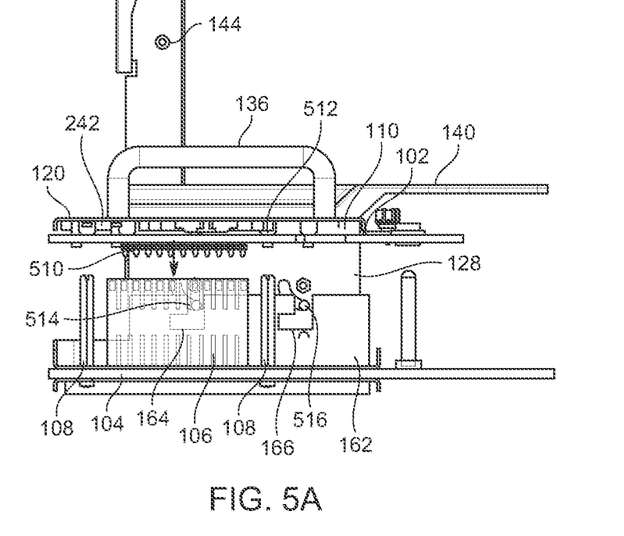
FIG. 5A is a side view of the example connector assembly in FIG. 2 with levers in an unlocked position for joining the circuit boards when the example connector assembly is in an open position, according to certain aspects of the present disclosure.
Figure 5B:
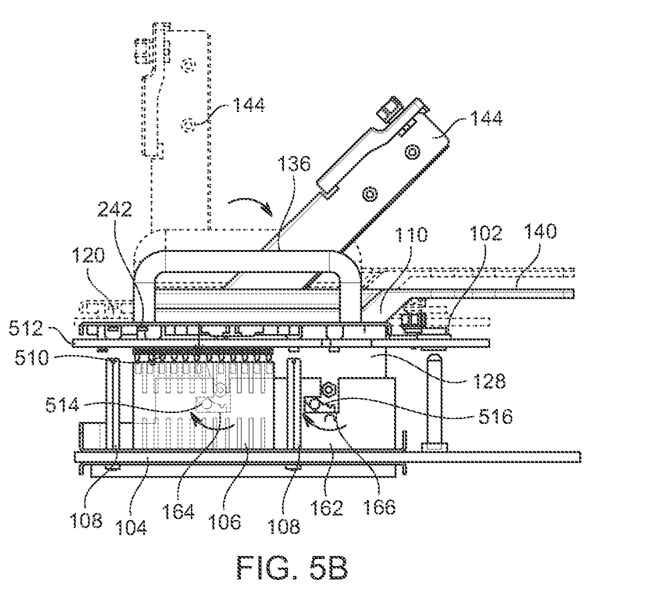
FIG. 5B is a side view of the example connector assembly in FIG. 2 with levers in an unlocked position for joining the circuit boards when the example connector assembly is in an open position, according to certain aspects of the present disclosure.
Figure 5C:
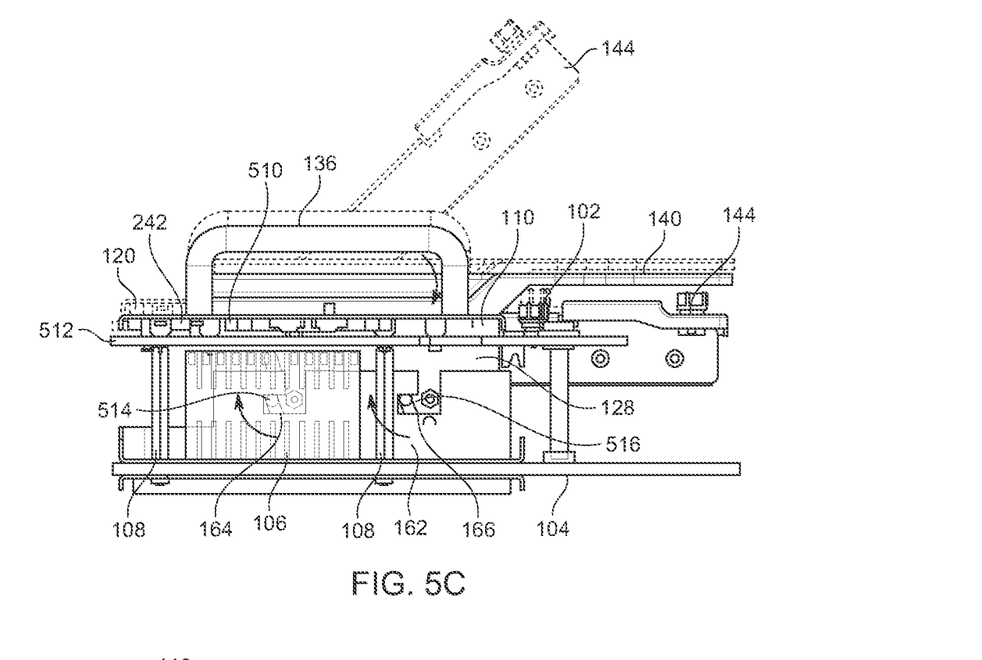
FIG. 5C is a side view of the example connector assembly in FIG. 2 with levers in an unlocked position for joining the circuit boards when the example connector assembly is in an open position, according to certain aspects of the present disclosure.

FIGS. 5A-5C are side cross-section views that show the initial sequence of locking and unlocking the levers 142 and 144 to attach the upper circuit board 102 to the lower circuit board 104 via the connector assembly 110. Identical elements in FIGS. 5A-5C are labeled with identical numerals to their counterparts in FIGS. 1A-1C. FIG. 5A shows the lever 144 of the connector assembly 110 rotated in the unlocked position. Thus, the handle 136 and the cover plate 140 attached to the cover bracket 242 have been moved to the open position toward the center of the support bracket 120.

The upper circuit board 102 and attached connector assembly 110 may be lowered to the lower circuit board 104. The bottom surface of the upper circuit board 102 has a series of electrical connectors 510 that may be mated with the board-to-board connectors 106 of the lower circuit board 104. The upper circuit board 102 has a series of fastener or screw holes 512 that each align with the location of one of the spacers 108 extending from the lower circuit board 104. As the connectors 106 are mated with the connectors 510, the side plate 128 of the support bracket 120 is inserted in alignment with the side bracket 162 of the lower circuit board 104. Two moveable pins 514 and 516 that extend from the side plate 128 are inserted in the slots 164 and 166 of the respective side bracket 162.

As shown in FIG. 5B, once the upper circuit board 102 is lowered on the lower circuit board 104, the lever 144 may be rotated. The rotation of the lever 144 moves a gearing mechanism attached to the side plate 128 that moves the pins 514 and 516 to a locked position in the slots 164 and 166.

When the lever 144 is rotated to the fully locked position shown in FIG. 5C, the pins 514 and 516 fix the side plate 128 to the side bracket 162, thereby ensuring the top circuit board and lower circuit board 104 are joined together. Screws may then be inserted to attach the spacers 108 to the upper circuit board 102. The other lever 142 operates in a similar manner to join the side plate 126 with the side bracket 160.

Figure 6A:
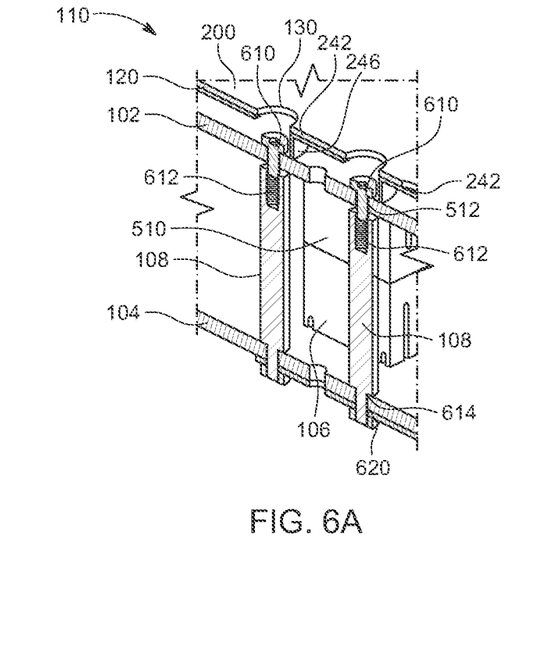
FIG. 6A is a close-up perspective view of the screws attaching the circuit board to another circuit board when the example connector assembly in FIG. 2 is in the closed position, according to certain aspects of the present disclosure.
Figure 6B:
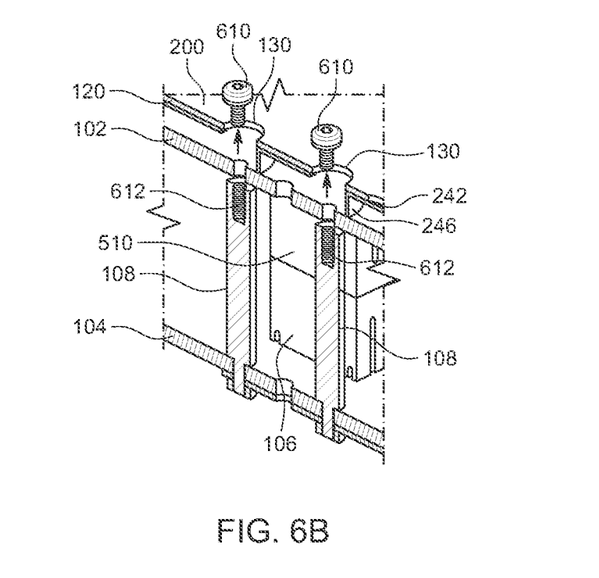
FIG. 6B is a close-up perspective view of the removal of screws attaching the circuit board to another circuit board when the example connector assembly in FIG. 2 is in the closed position, according to certain aspects of the present disclosure.
Figure 6C:
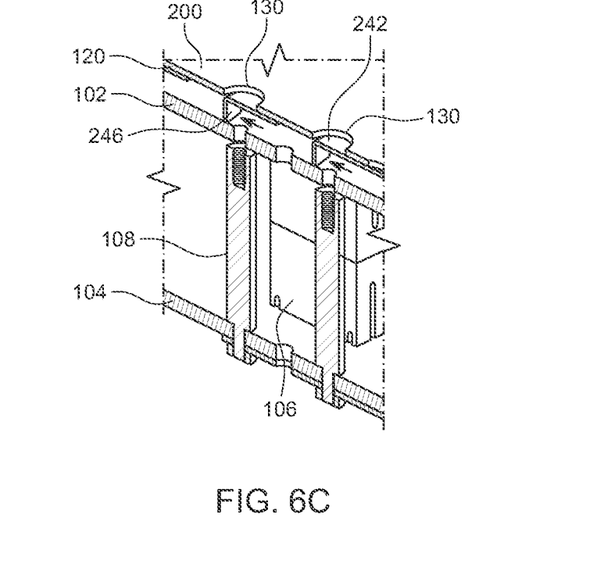
FIG. 6C is a close-up perspective view of the example connector assembly in FIG. 2 being moved to the open position once the screws are removed, according to certain aspects of the present disclosure

FIGS. 6A-6C show perspective views of the sequence of closed and open positions of the connector assembly 110 that allow the removal of the screws when disassembling the circuit board 102 from the circuit board 104. FIG. 6A shows the connector assembly 110 in the closed position that allows screws 610 to be either inserted or removed from the screw access holes 130 in the support bracket 120. In the closed position, the screw access holes 130 of the support bracket 120 are aligned with the screw holes 246 of the cover bracket 242. The screws 610 may thus be inserted through the screw holes 512 in the circuit board 102 and into a corresponding bore 612 in one of the spacers 108. Each of the spacers 108 includes a pin 614 that may be fixed in a corresponding hole 620 in the lower circuit board 104. The board-to-board connector 106 is mated with the connector 510 on the bottom surface of the upper circuit board 102.

Since the screw access holes 130 and 246 are aligned in the closed position, the screws 610 may be removed from the circuit board 102. Alternatively, after the circuit board 102 is joined to the circuit board 104 via rotating the levers 142 and 144 in FIG. 2 to the locked position, screws may be inserted through the screw access holes 130 and 246. FIG. 6B shows the screws 610 in the process of being removed through the screw access holes 130 and 246 of the connector assembly from the bores 612 of the spacers 108. Once all of the screws 610 are removed, the cover bracket 242 may be moved to the open position.

FIG. 6C shows the connector assembly 110 in an open position that prevents screws from being inserted in the screw holes 130 in the support bracket 120. As shown in FIG. 6C, the cover bracket 242 has been moved so the screw access holes 246 are out of alignment with the screw access holes 130 of the support bracket 120. In order to move the cover bracket 242 to the open position, all the screws that attach the upper circuit board 102 to the lower circuit board 104 must be removed.

The advantage of the example connector assembly 110 is to only allow separation of two joined circuit boards 102 and 104 when all of the screws attaching the circuit boards 102 and 104 have been removed. This prevents damage from improper disassembly procedure. The connector assembly 110 allows a user to clearly know which screws should be installed or disassembled when assembling or disassembling the circuit boards 102 and 104. Thus, a user does not have to review instructions and potentially damage the structure. Using the screws locked on the circuit board 102 to limit the movement of the cover brackets 240 and 242 ensures that the screws are all removed before the cover brackets 240 and 242 may be moved. This allows the circuit board 102 to be removed from the circuit board 104 only after all the screws are removed.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A connector assembly for connecting an upper circuit board to a lower circuit board, wherein the upper circuit board includes a fastener hole for a fastening device allowing attachment to the lower circuit board, the connector assembly comprising:
a support bracket having a first access hole aligned with the fastener hole of the upper circuit board, the support bracket being configurable to be positioned over the upper circuit board; and
a cover bracket having a second access hole, the cover bracket being suspended between the support bracket and the upper circuit board, the cover bracket being moveable between an open position and a closed position, wherein the first and second access holes are aligned in the open position, and wherein the cover bracket blocks access between the first access hole of the support bracket and the fastener hole of the upper circuit board.

2. The connector assembly of claim 1, wherein the upper circuit board includes a connector that may be mated with a board-to-board connector of the lower circuit board.

3. The connector assembly of claim 1, wherein the support bracket includes a side plate that contacts the lower circuit board.

4. The connector assembly of claim 3, wherein the side plate includes a rotating lever that is attached to a connection mechanism to engage a side bracket of the lower circuit board, the rotating lever rotating between a locked position and an unlocked position.

5. The connector assembly of claim 4, wherein the cover bracket includes a cover plate extending through the support bracket, wherein the cover plate is extended over the rotating lever when the cover bracket is in the open position to prevent the lever from being rotated to the unlocked position.

6. The connector assembly of claim 1, wherein the fastening device includes one or more screws.

7. The connector assembly of claim 1, wherein the support bracket includes an indicator indicating the open or closed position.

8. The connector assembly of claim 1, further comprising a handle attached to the cover bracket extending through a slot in the support bracket.

9. The connector assembly of claim 1, further comprising:
a gear; and
another cover bracket including a rack engaging the gear, wherein the cover bracket includes a rack engaging the gear.

10. The connector assembly of claim 1, wherein the fastening device engages a spacer connected to the lower circuit board.

11. The connector assembly of claim 10, wherein the board-to-board connector is a rectangular shape, and wherein the spacer is one of four spacers in proximity to the board-to-board connector.

12. A computer system comprising:
a lower circuit board including a series of spacers;
an upper circuit board having a series of screw holes, each screw hole being in alignment with one of the spacers;
a connection assembly having a support bracket positioned over the upper circuit board, and a first and second cover bracket suspended between the support bracket and the upper circuit board, wherein the support bracket includes a series of first screw access holes, each of the first and second cover bracket includes a series of second screw access holes, each of the first and second cover bracket having a closed position relative to the support bracket that aligns the first screw access holes to allow access to the second screw access holes, each of the first and second cover bracket having an open position that blocks the first screw access holes of the support bracket to the screw holes of the upper circuit board.

13. The computer system of claim 12, wherein the upper circuit board includes a connector that may be mated with a board-to-board connector of the lower circuit board.

14. The computer system of claim 12, wherein each support bracket includes a side plate that contacts the lower circuit board.

15. The computer system of claim 14, wherein the side plates each include a rotating lever that is attached to a connection mechanism to engage a side bracket of the lower circuit board, the rotating levers rotating between a locked position and an unlocked position.

16. The computer system of claim 15, wherein each cover bracket includes a cover plate extending through the support bracket, wherein the cover plates are extended over the levers when the cover brackets are in the open position to prevent the levers from being rotated to the unlocked position.

17. The computer system of claim 12, wherein the support bracket includes an indicator indicating the open or closed position.

18. The computer system of claim 12, further comprising a handle attached to each of the cover brackets, each of the handles extending through a slot in the support bracket.

19. The computer system of claim 12, further comprising a gear attached to a lower surface of the upper circuit board, wherein each cover bracket includes a rack engaging the gear.

20. A method of assembling an upper circuit board with an attached connector assembly to a lower circuit board, wherein the connector assembly is attached to the upper circuit board and includes a cover bracket with a support bracket suspended over the upper circuit board, the method comprising:
mating a board-to-board connector of the lower circuit board with the upper circuit board;
moving a cover bracket having an access hole to an open position to allow activation of an attachment mechanism;
moving the cover bracket to a closed position relative to a support bracket to align the access hole with an access hole of the support bracket; and
inserting a screw through the aligned access holes to attach the upper circuit board to a spacer of the lower circuit board.

* * * * *